United States Patent
Burgio

(10) Patent No.: US 9,634,624 B2
(45) Date of Patent: Apr. 25, 2017

(54) METHOD OF OPERATING DIGITAL-TO-ANALOG PROCESSING CHAINS, CORRESPONDING DEVICE, APPARATUS AND COMPUTER PROGRAM PRODUCT

(71) Applicant: STMICROELECTRONICS S.r.l., Agrate Brianza (MB) (IT)

(72) Inventor: Carmelo Burgio, Bergamo (IT)

(73) Assignee: STMICROELECTRONICS S.R.L., Agrate Brianza (MB) (IT)

(*) Notice: Subject to any disclaimer, the term of this patent is extended or adjusted under 35 U.S.C. 154(b) by 0 days.

(21) Appl. No.: 14/860,847

(22) Filed: Sep. 22, 2015

(65) Prior Publication Data
US 2016/0191005 A1    Jun. 30, 2016

(30) Foreign Application Priority Data
Dec. 24, 2014 (IT) .............................. TO2014A1098

(51) Int. Cl.
| | |
|---|---|
| H04B 15/00 | (2006.01) |
| H03F 3/217 | (2006.01) |
| H03M 1/10 | (2006.01) |
| H03M 1/66 | (2006.01) |

(52) U.S. Cl.
CPC ........ H03F 3/2175 (2013.01); H03M 1/1023 (2013.01); H03M 1/1038 (2013.01); H03M 1/1076 (2013.01); H03M 1/66 (2013.01)

(58) Field of Classification Search
CPC .......... H03G 3/20; H03G 3/3005; H03G 3/32; H03F 2200/03
USPC ................................ 381/94.6, 107, 108, 121
See application file for complete search history.

(56) References Cited

U.S. PATENT DOCUMENTS

| | | | |
|---|---|---|---|
| 6,204,783 | B1 | 3/2001 | Paz et al. |
| 6,577,987 | B1 | 6/2003 | Wenning |
| 8,525,710 | B1* | 9/2013 | Tsang .................. H03M 1/0607 341/118 |
| 8,698,506 | B2 | 4/2014 | Kehl et al. |
| 2011/0068963 | A1 | 3/2011 | Kehl |
| 2011/0291868 | A1 | 12/2011 | Kehl |
| 2014/0301558 | A1* | 10/2014 | Fan ..................... G10L 21/0208 381/71.2 |

* cited by examiner

*Primary Examiner* — Alexander Jamal
(74) *Attorney, Agent, or Firm* — Slater Matsil, LLP

(57) ABSTRACT

A signal processing chain, such as an audio chain, produces an analog output signal from a digital input signal. The signal processing chain is operated by generating a first flag signal for the analog output signal and one or more second flag signals for the digital input signal. Each flag signal assumes a first level or a second level and is set to the first level when a signal from which the flag is generated has a value within an amplitude window. An amount the first flag signal for the analog output signal and the second flag signal for the digital input signal match each other may be calculated for issuing an alert flag which indicates an impaired operation of the signal processing chain.

24 Claims, 8 Drawing Sheets

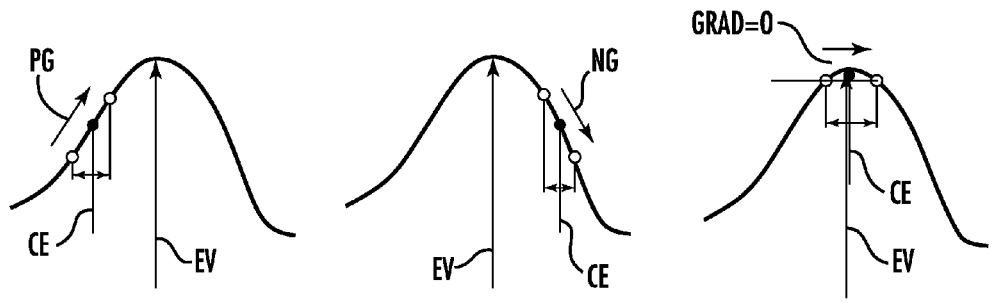
*FIG. 10A*  *FIG. 10B*  *FIG. 10C*
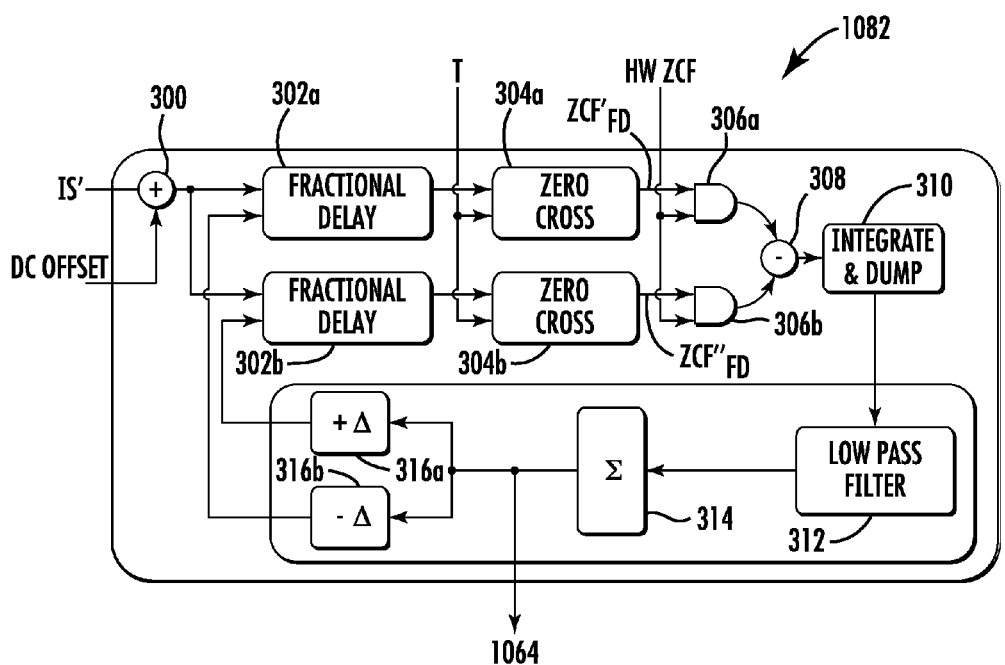
*FIG. 11*

METHOD OF OPERATING DIGITAL-TO-ANALOG PROCESSING CHAINS, CORRESPONDING DEVICE, APPARATUS AND COMPUTER PROGRAM PRODUCT

FIELD OF THE INVENTION

The description relates to Digital-to-Analog (D/A) processing chains. One or more embodiments may apply to detecting and/or compensating malfunctioning of such a signal processing chain. Detecting and/or compensating an undesired DC offset in a power amplifier of an audio system is exemplary of an application of one or more embodiments.

BACKGROUND

Capacitors may be used at the input side of an amplifier to remove any DC offset in the amplifier input signal, thereby preventing DC current from flowing to the speakers. In the event these capacitors fail or are not present (e.g., due to an incorrect wiring) substantial damage may be caused to the amplifier and/or the speakers. Audio systems, e.g., for car audio may include a DC offset detection function based on different approaches implemented in the analog domain.

Examples of such approaches are clipping event count or detecting the time elapsed between consecutive zero crossing events of the analog signal, that is, between events leading the analog signal to enter/exit a certain amplitude window. In the latter case, a vertical displacement of the audio signal as possibly generated by a DC offset may cause the pulses indicative of zero crossing to appear, disappear, move, mix together or change length. A DC offset detection circuit sensitive to such events may thus detect an offset voltage difference between, e.g., the output(s) of an audio power amplifier and the audio processor feeding such amplifier.

In certain implementations, a zero window crossing flag may be used as a feedback signal for a circuit which emulates internally the zero crossing window and may check, e.g., if the signal at the loudspeaker outputs of the audio power amplifier crosses the zero level at the same time as at the output of the audio processor. In certain implementations aiming at reducing costs, the flags from 4/6 loudspeakers may be mixed together (e.g., OR-ed) and then sent to the analog processor. A certain amount of loop delay may be taken into account by a tunable external capacitor.

Such implementations rely on dedicated analog components which may be fairly bulky and expensive. Also, the amount of DC offset cannot be detected and no other possible source of impairment taken into account. The detection process may be affected by intrinsic inaccuracy due to the uncertainty of parameters (e.g., the threshold levels, gain, . . . ).

SUMMARY

One or more embodiments may relate to a device and apparatus (e.g., an audio chain) including such a device as well as to a computer program product loadable in the memory of at least one processing device (e.g., a DSP) and including software code portions for executing the steps of the method when the product is run on at least one computer. As used herein, reference to such a computer program product is understood as being equivalent to reference to a computer-readable means containing instructions for controlling the processing system in order to co-ordinate implementation of the method according to the invention. Reference to at least one processor device is intended to highlight the possibility for the present invention to be implemented in a modular and/or a distributed form.

One or more embodiments may be based on the recognition that a (fully) digital approach may be used to detect undesired analog signal components since a sampled version of the signal subjected to DAC conversion is available at the input of the processing. For instance, in the case of an audio processing chain fed with a conventional digital audio signal (e.g., according to the CD Redbook standard), a sampled version (44.1/48.0 kHz Fs) of the audio stream may be available at the digital decoder.

BRIEF DESCRIPTION OF THE DRAWINGS

One or more embodiments will now be described, purely by way of non-limiting examples, with reference to the annexed figures, wherein:

FIG. 10, including three portions designated a), b) and c), respectively, is exemplary of possible operation of embodiments;

FIGS. 11 to 13 are block diagrams exemplary of various functions which may be performed in one or more embodiments.

DETAILED DESCRIPTION

In the ensuing description one or more specific details are illustrated, aimed at providing an in-depth understanding of examples of various embodiments. The embodiments may be obtained without one or more of the specific details, or with other methods, components, materials, etc. In other cases, known structures, materials, or operations are not illustrated or described in detail so that certain aspects of embodiments will not be obscured.

Reference to an embodiment or one embodiment in the framework of the present description is intended to indicate that a particular configuration, structure, or characteristic described in relation to the embodiment is comprised in at least one embodiment. Hence, phrases such as in an embodiment or in one embodiment that may be present in one or more points of the present description do not necessarily refer to the same embodiment. Moreover, particular confirmations, structures, or characteristics may be combined in any adequate way in one or more embodiments.

The references used herein are provided merely for convenience and hence do not define the scope of protection or the scope of the embodiments.

Figure 1:
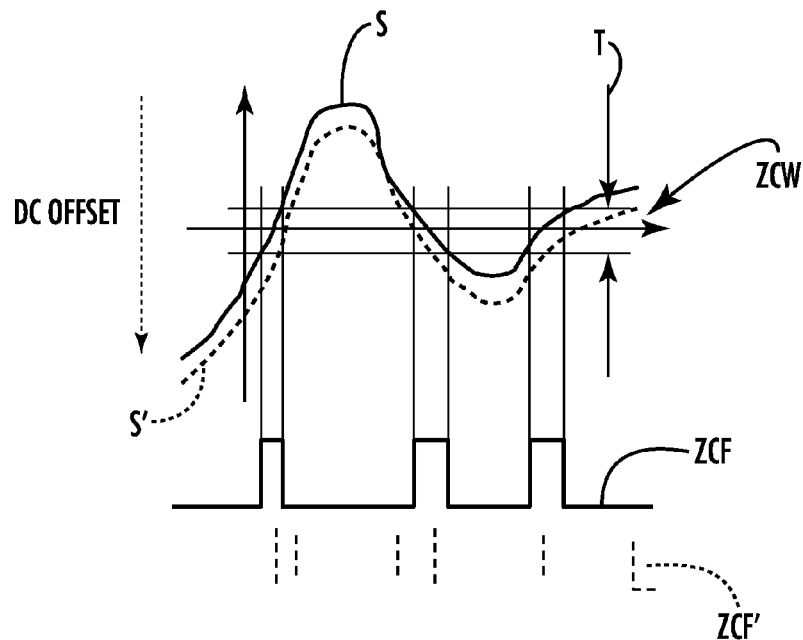
FIG. 1 is a schematic representation of zero crossing events which may lead a signal to enter/exit a certain amplitude window.

FIG. 1 is a schematic representation of zero crossing events which may lead a signal S (e.g., an analog audio signal) to enter/exit a certain amplitude window ZCW, whose width is identified by a threshold value T.

For the sake of simplicity, throughout this description reference will be made to a window ZCW centered about a zero value, i.e., a symmetrical window between −T and +T. The signal S will thus be inside the window ZCW when having a value between −T and +T, and outside the window ZCW when having a value below −T or above +T.

Those of skill in the art will otherwise appreciate that in one or more embodiments the window ZCW may be non-symmetrical and/or centered about a non-zero value, so that the crossing events leading the signal S to enter/exit the amplitude window ZCW may not necessarily be zero crossing events. Consequently, throughout this exemplary description, referring to zero crossing will be for the sake of brevity and simplicity only, with no limitation to the embodiments.

The diagram of FIG. 1 is generally exemplary of the possibility of generating (e.g., a threshold comparator) a flag signal ZCF indicating if the value of the signal from which the flag is generated S lies within the window ZCW or outside the window ZCW.

For instance, as exemplified in FIG. 1, the flag ZCF may be set to 1 if the signal S is within the window ZCW and set to 0 if the signal S is outside the window ZCW. A complementary choice (e.g., 0 if within the window ZCW and 1 if outside) is however possible.

The diagram of FIG. 1 is exemplary of the possible effect of a DC offset leading the signal S to slide down and thus become a signal S' which enters/exits the window ZCW at different times with respect to the signal S, as reflected by a corresponding change in the flag signal ZCF'. The diagram of FIG. 1 is thus exemplary of the possibility of detecting a DC offset based on possible changes in the flag signal ZCF.

A number of issues may however arise when attempting to apply such a concept, e.g., in checking operation of a D/A processing chain (e.g., an audio amplifier chain fed with an audio signal from a CD player).

The information content of the actual final analog signal resulting from D/A conversion may in fact be different from the content conveyed by the digital version, so that the zero crossing behavior of the actual signal deriving from D/A conversion may be different from the behavior of the digital version of the audio stream.

This may be due to various factors, such as, e.g., the (generally unknown) delay of the analog signal respect the digital version, due to the hardware (both analog and digital) between the digital stream processing and the power amplifier.

One or more embodiments may rely on the approach schematically represented in FIG. 1 by producing a sampled version of the flag signal ZCF (used as a feedback signal, e.g., from the analog output of an audio power amplifier) so that the related information may be processed in the digital domain. In one or more embodiments this may take place via digital hardware and/or software, thus increasing the level of monitoring of the analog environment.

One or more embodiments may thus exploit two types of data, i.e.:

the digital version of the signal before D/A conversion (e.g., an input digital audio stream), to be sent to the analog environment; and a sampled version of the ZCF flag signal as received from the analog environment (e.g., from the output of analog power amplifier, for instance from the wire terminals for connecting to the speaker cables).

One or more embodiments may thus generate in the digital domain (e.g., 44.1 kHz SW) an expected predicted behavior of the (analog) flag ZCF: any differences between the predicted version, e.g., Est. ZCF of the flag and the sampled version of the actual flag HW ZCF from the output of the D/A processing chain (e.g., from the power audio amplifier) may thus be indicative of a problem occurring, leading to performance being impaired.

One or more embodiments may thus rely on the recognition that the effects of the D/A processing chain on the signal fed thereto may be predicted/estimated in the digital domain in order to create a good replica of the analog waveform.

Figure 2:
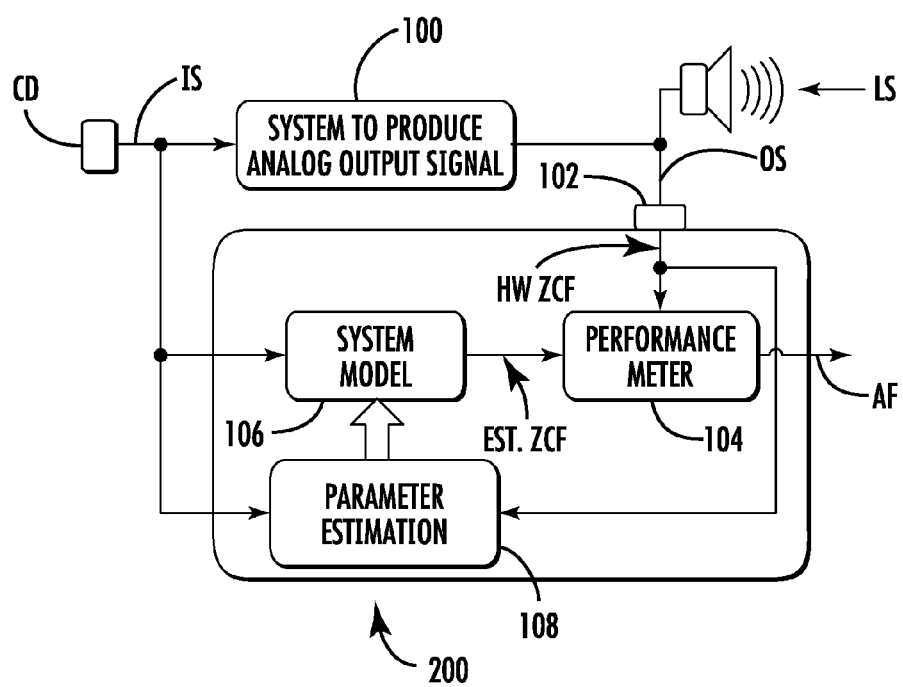
FIG. 2 is general block diagram of a system for checking operation of a digital-to-analog processing chain.

This concept is schematically represented in the diagram of FIG. 2, where IS denotes a digital signal from a source CD. The signal IS is input to a physical system 100 which produces therefrom an analog output signal OS, e.g., an audio signal to be fed to one or more loudspeakers LS.

At 102 the signal OS is subjected (e.g., via thresholding with a threshold comparator) to ZCF processing as exemplified in FIG. 1 to produce a ZCF signal, which may be an on/off signal. Also, this on/off ZCF signal may be sampled, e.g., with a degree of accuracy comparable to the accuracy of D/A as performed in the system 100 to generate a corresponding stream of data suitable for processing in the digital domain.

For instance, in one or more embodiments, the sampled hardware ZCF signal HW ZCF may be fed to a performance meter circuit/function 104 to be compared with a ZCF signal Est. ZCF as estimated (e.g., predicted) by a system model circuit/function 106.

The performance meter 104 may thus compare the two ZCF signals (i.e., HW ZCF sampled from the output of the system 100 and Est. ZCF predicted in the system 106) and, based on the results of comparison, issue an output signal (e.g., an alert flag AF) possibly indicative of the performance behavior of the system 100 swerving from a desired/expected behavior.

In one or more embodiments, as better detailed in the following, the system model 106 may operate on the signal IS as well as on input provided by a parameter estimation circuit/function 108, which in turn may operate both on the signal IS and on the sampled ZCF signal obtained at 102.

Referring to the blocks in FIG. 2 (and in the other figures discussed in the following) as circuit/function blocks refers to the possibility, already mentioned in the foregoing, that the related processing may be performed by digital hardware and/or software (e.g., as processing functions in a Digital Signal Processor or DSP).

Figure 3:
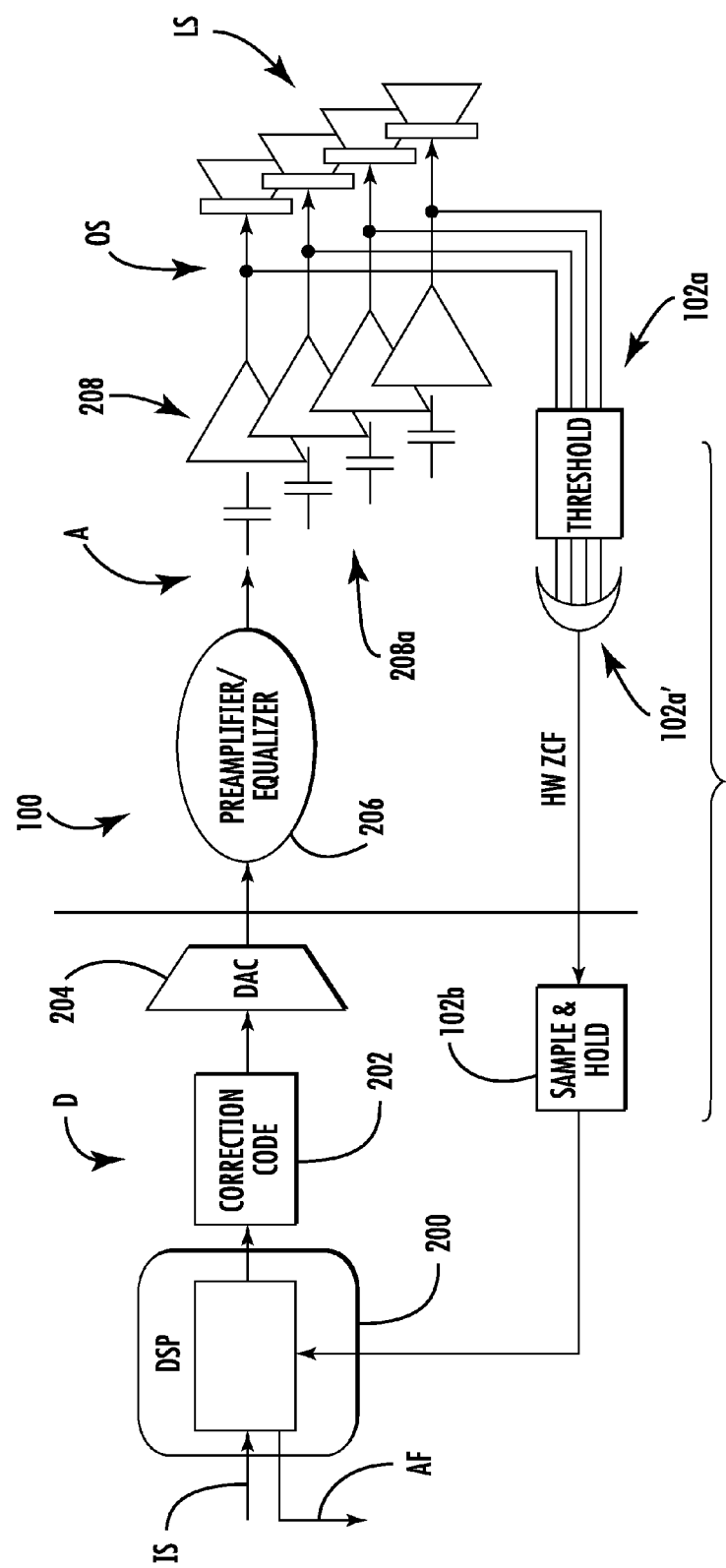
FIG. 3 is an exemplary circuit diagram of a system according to one or more embodiments.

FIG. 3 is an exemplary circuit diagram of a system according to one or more embodiments where the approach presented in FIG. 2 may be applied. Reference is made again for the sake of simplicity to the exemplary case of an audio chain receiving an digital input signal IS, e.g., a 44.1 kHz/16 bit Redbook audio signal.

Reference 200 in FIG. 3 indicates a digital processor (e.g., a DSP) adapted to process the signal IS and to perform, e.g., the processing tasks exemplified by the blocks 104, 106 and 108 in FIG. 2.

The blocks 202, 204, 206 and 208 are exemplary of a processing chain configured to operate on the input signal IS and including both a digital portion D and an analog portion A.

The blocks in question may include, e.g.:

digital hardware such as an interpolator/error correction code (e.g., Reed-Solomon) circuitry 202;

a digital-to-analog (DAC) converter stage 204;

analog circuitry such as, e.g., a stereo/multichannel preamplifier/equalizer 206; and a power amplifier stage 208 (e.g., multichannel) to produce an analog output signal OS for driving a set of loudspeakers LS. DC-offset filtering capacitors 208a may possibly be provided in the power amplifier stage 208.

The circuit/function 102 of FIG. 2 is exemplified in FIG. 3 as including a thresholding stage 102a sensitive to the output signal OS to produce a hardware ZCF flag (1 or 0) as discussed in the foregoing.

In one or more embodiments, as exemplified in FIG. 3, the output signal OS may in fact include a plurality of output signal components (e.g., the output signals of a stereo/multichannel power amplifier). In one or more embodiments the thresholding stage 102a may thus include, e.g., a plurality of comparators performing respective windowing functions (with respective thresholds, which may be the same or different for the various signal components) with the flag signal HW ZCF for the analog output signal OS produced as a combination, e.g., as produced in an OR gate 102a', of the result of thresholding operations performed on a plurality of distinct output signal components.

However produced (e.g., from a single output signal or via a combination of plural output signal components) the hardware ZCF flag may be sampled in a sampling stage (possibly a sample & hold stage) 102b with a sampling frequency consistent with a degree of accuracy consistent with the operation frequency of the processor 200 (e.g., 44.1/48 kHz Fs).

In performing a desired A/D conversion, a processing chain as exemplified in FIG. 3 may diversely affect the signals processed therein by, e.g.:

introducing an analog/digital loop delay, possibly frequency-dependent and different for each power amplifier 208;

producing variable sampling effects at the A/D interface (e.g., S&H 102b);

applying variable analog gains (e.g. at 206 and 208) and threshold values (at 102a), possibly different for each amplifier/channel; and introducing a DC offset, possibly different for each power amplifier/channel.

In one or more embodiments, proper operation of such a processing chain may be checked based on a comparison of the hardware feedback signal HW ZCF which represents the flag ZCF signal generated from the output of the chain (e.g., from the output of the power amplifiers 208) as sampled at 102b with one or more common estimated flags, e.g., Est. ZCF as predicted by the processor 200.

In one or more embodiments, various conditions may thus apply when comparing two ZCF flags as schematically illustrated in TABLE 1 below.

TABLE 1

| HW ZCF | | |
|---|---|---|
| 0 | 0 | No useful meaning |
| 0 | 1 | False ZCF |
| 1 | 0 | Missed ZCF |
| 1 | 1 | Correct ZCF detection |

The No ZCF condition, e.g., HW ZCF=0 Est. ZCF=0 (that is, with both signals off window) as well as the False ZCF and Missed ZCF conditions (that is, with either signal off window) may be hardly of interest for comparing two ZCF signals because in those cases the value of the actual output analog signal OS can be totally different from any digital estimation thereof.

In one or more embodiments, only the 1-1 condition, e.g., HW ZCF=1 Est. ZCF=1 (i.e., with both signals lying within the respective threshold window) may be taken into account in comparing the signals IS and OS, e.g., in checking performance of the chain by evaluating the matching of two ZCFs.

Stated otherwise, in one or more embodiments, comparison of two ZCF signals may be elected to be performed only when the two ZCF signals at issue may be regarded as produced from signals whose amplitude falls within a respective window ZCW, e.g., when the output of the chain (e.g., from the output(s) of the power amplifiers 208) is within the respective window ZCW (see FIG. 1) and the same may be held to apply for any common estimated signal as predicted in the processor 200.

As indicated, a processing chain as exemplified in FIG. 3 may diversely affect the signals processed therein so that the characteristics of, e.g., the HW ZCF flag may be affected. The diagrams of FIGS. 4 to 6 are exemplary of how this may occur.

Figure 4:
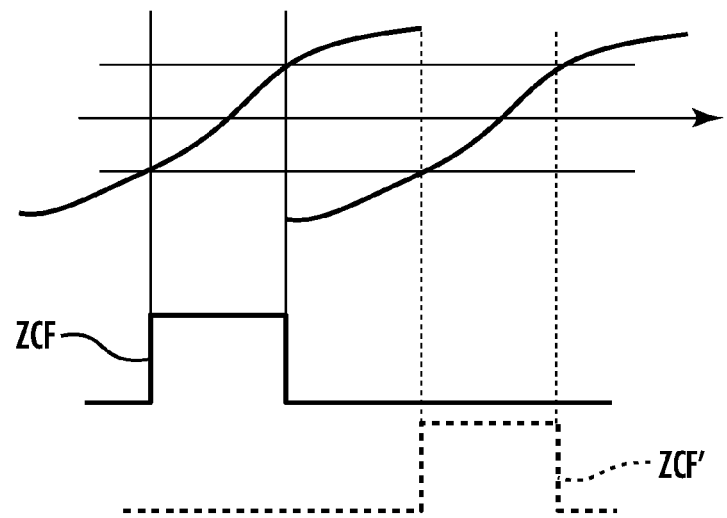
FIGS. 4 to 7 are schematic representations of how zero crossing events of a signal may be affected by various factors.

The diagram of FIG. 4 shows by way of example the possible effect of a loop delay (e.g., due to the elements 202 to 208 of FIG. 3). This may be possibly frequency-dependent and different, e.g., for each power amplifier 208, and may produce a corresponding delay (ZCF to ZCF') in the HW ZCF flag.

Figure 5:
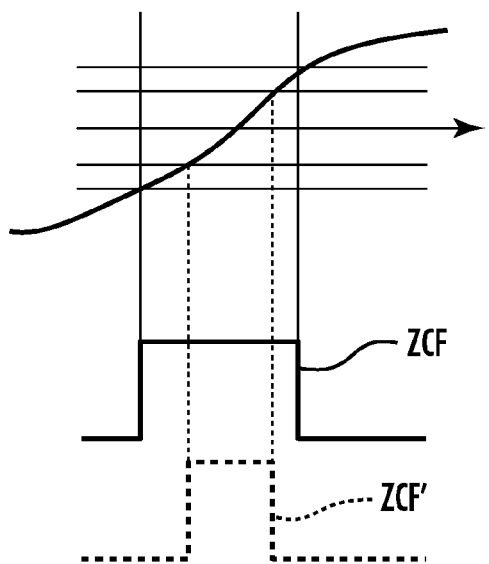

The diagram of FIG. 5 is exemplary of a threshold variation which may cause both width variation and delay (again ZCF to ZCF') in the HW ZCF flag. It will be appreciated that a thoroughly similar effect may arise if the threshold(s) set, e.g., at 102a in FIG. 3 remain(s) constant while the gain applied to the signal subject to windowing or thresholding varies (e.g., due to a volume adjustment in an audio chain). Threshold variation will thus be understood herein as a relative variation of the threshold(s) with respect to the amplitude (gain) of the signal to which the threshold (s) apply.

Figure 6:
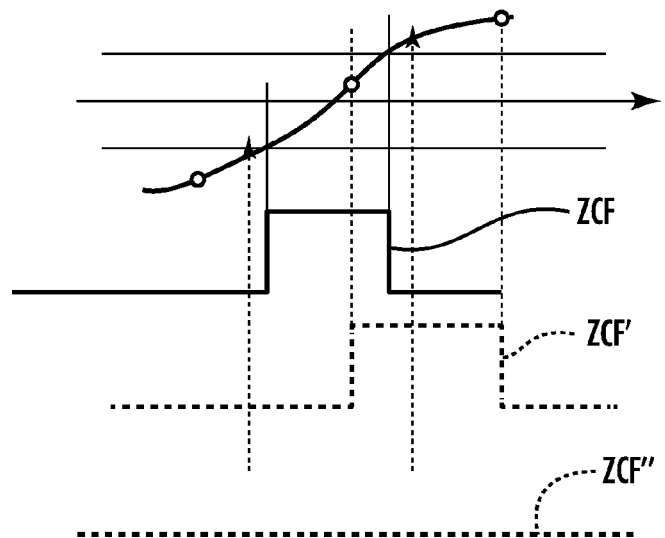

The diagram of FIG. 6 is exemplary of possible effects of the sampling process, e.g., a variation of the sampling instants for an otherwise constant sampling rate: a flag ZCF notionally having the time behavior illustrated as a solid line may be sampled as a time-offset flag ZCF' of a different width if the sampling instants correspond to the circles, and even as a no-flag ZCF signal if the sampling instants correspond to the triangles.

Figure 7:
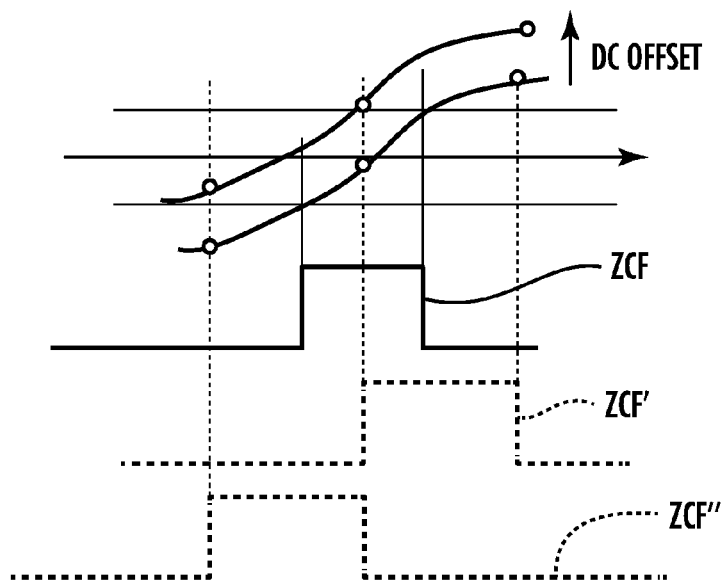

The diagram of FIG. 7 is exemplary of the possible effect of DC offset on a sampling process at the instants indicated by circles. Even with the same sampling instants, a flag ZCF notionally having the time behavior illustrated as a solid line may be sampled either as a time-offset (delayed) flag ZCF' or as a time-offset (anticipated) flag ZCF".

Those skilled in the art will appreciate that the discussion above applies irrespective of whether a 1 or 0 is assigned to the ZCF flag to indicate that the corresponding signal lies within the window ZCW.

In one or more embodiments, processing of the digital input data stream (e.g., 44.1 kHz) at 200 may be tuned by acting on the estimation parameters, in order to match the analog output signal when the D/A processing chain (e.g., 202, 204, 206, 208) is operating correctly, so that a possible mismatch may be reliably taken as an indication of operation being no longer satisfactory.

One or more embodiments may thus involve comparing (e.g., at 104 in FIG. 2) two flag signals HW ZCF (obtained from the analog output) and Est. ZCF (obtained from the digital input) and calculating as a function of the result of the ZCF comparison a performance check signal which indicates an amount the respective flag signals HW ZCF, Est. ZCF correspond (i.e., match) with each other.

The performance check signal in question may thus indicate the performance quality of the processing chain (202, 204, 206, 208) and may take, e.g., the form of an alert flag AF issued from the performance meter block 104 when the degree of matching of the flag signals HW ZCF, Est. ZCF falls below a certain performance quality threshold. That is, when the two flag signals HW ZCF, Est. ZCF are found no longer to match satisfactorily with each other.

Figure 8:
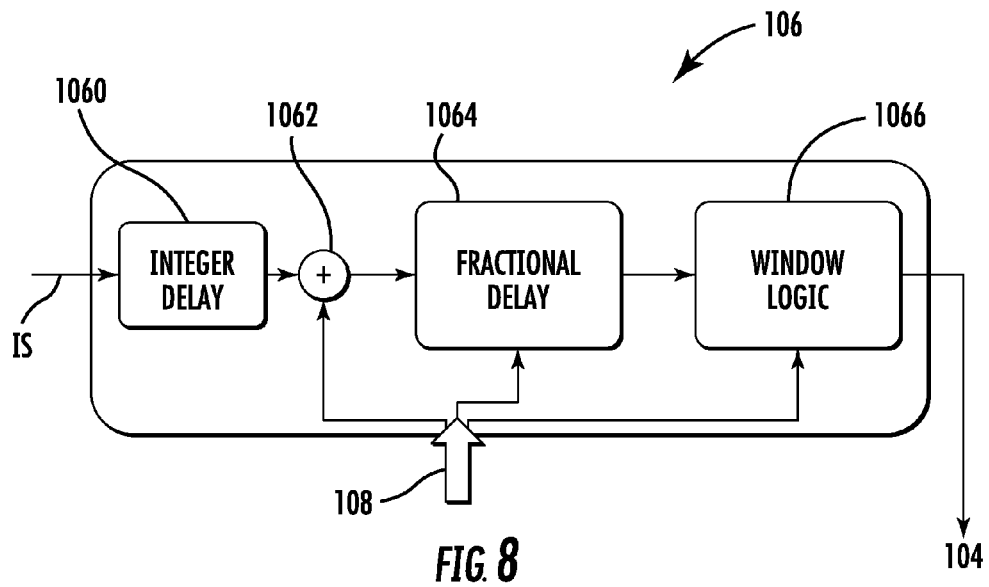
FIGS. 8 and 9 are block diagrams exemplary of various functions which may be performed in one or more embodiments.

In one or more embodiments, a system, such as, e.g., an audio chain as exemplified herein, may be pre-loaded (e.g., in production) with values of estimation parameters applied, e.g., to a system model block 106 as schematically represented in FIG. 8. For instance, the digital input signal IS may be subjected to one or more of, e.g., a bulk integer delay 1060, adding/subtracting a DC offset at 1062, a further fractional delay 1064 and a windowing (thresholding) operation in order to produce an estimated ZCF value Est. ZCF which, when the system operates as expected, matches (e.g., within a certain tolerance range) the flag signal HW ZCF obtained for the analog output signal OS, e.g., from the S & H block 102b.

A possible mismatch of the flag signals HW ZCF, Est. ZCF may thus be held to indicate performance degradation (e.g. malfunctioning) so that a corresponding alert flag AF may be issued (e.g., from the block 104 of FIG. 2), e.g., as a warning signal (e.g., optical and/or sound).

In one or more embodiments as discussed in the following in connection with FIGS. 9 to 14, a system as the audio chain exemplified herein may be configured for possible estimation, performed run-time, e.g., during operation of operating parameters which may be fed e.g. to the system model block 106 from the parameter estimation block 108. This may be arranged as exemplifies in FIG. 9. For example, this may be in view of a possible operation based on the concept outlined in FIG. 10, with the estimated parameters converging to a correct value EV.

In one or more embodiments, a count of matches of flag signals including a hardware flag signal (e.g., HW ZCF) obtained from the analog output OS with certain flag signals obtained by processing the digital input signal IS may be used as a metrics in such estimation process which is suitable to be performed run time, e.g., during system operation.

In one or more embodiments, one or more such estimated parameters (e.g., DC offset, delay) as considered herein may be used to generate an alert signal (e.g., AF as described previously).

In one or more embodiments (e.g., as further discussed in the final part of this description), one or more such estimated parameters (e.g., DC offset, delay) as considered herein may be used to drive a control loop in order to compensate the phenomenon leading to impairment of performance.

In these cases, the system will be able to self-compensate the source of impairment thus ensuring that, e.g., HW ZCF and Est. ZCF as discussed previously will mostly match, so that direct comparison of these two ZCFs will no longer be essential.

Figure 9:
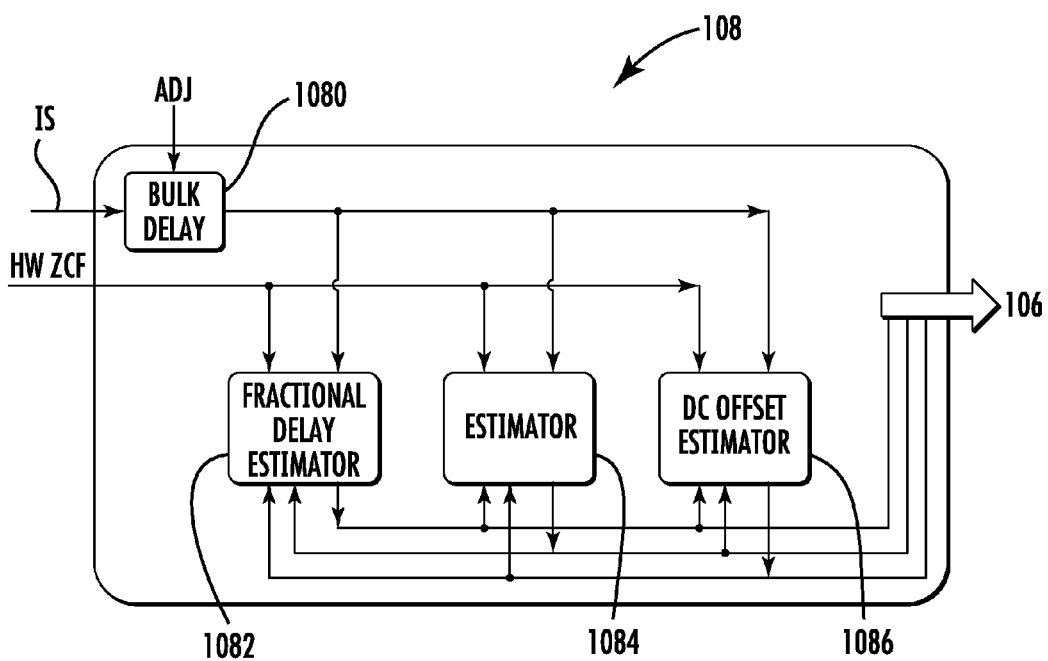

Similar comparisons between, e.g., HW ZCF and other ZCF flags obtained from the digital input signal IS may however be performed in parameter estimation/tracking as performed in the exemplary estimation layout shown in FIG. 9, where the block 108 includes, possibly in addition to an adjustable integer or bulk delay ADJ (adapted to be used for e.g. trimming the estimator):

a first estimation circuit/function 1082 for a fractional (e.g., fine adjustment) delay to be applied at 1064;

second estimation circuit/function 1084 of one or more threshold(s) for windowing at 1066; and a third estimation circuit/function 1086 for a DC offset to be applied at 1062.

In one or more embodiments as exemplified herein, the bulk or integer delay to be applied at 1080 may be an initial, rough adjustment parameter ADJ of the system, not intended to be subsequently modified.

One or more embodiments may provide for a different choice of the parameters being estimated: for instance, in one or more embodiments, not all of delay, threshold and DC offset but only one or two of there parameters may be considered. In one or more embodiments, other parameters may be added to and/or substituted for delay, threshold and DC offset.

The diagrams of FIGS. 10 to 14 are exemplary of one or more embodiments where the estimation parameters (e.g., block 108 in FIG. 2) may be determined during operation of the system (e.g., during a training phase and/or during regular operation) so that events resulting in impaired system performance may be detected (and possibly made known, e.g., by issuing an alert flag AF) and/or compensated.

In one or more embodiments as exemplified in FIG. 9, the estimator blocks 1082, 1084 and 1086 may operate by determining an exact (target) value EV for each parameter as a stationary point for a performance function.

Such an approach is schematically represented in the diagrams of FIG. 10, where:

the portion a) shows a current estimated value CE which is, e.g., lower than the exact value EV, so that a corresponding performance function exhibits a positive gradient PG towards a peak (e.g., optimum) value;

the portion b) shows a current estimated value CE which is, e.g., higher than the exact value EV, so that the corresponding performance function exhibits a negative gradient NG away from the peak value; and the portion c) shows a current estimated value CE which is at or in close proximity of the exact value EV, so that the corresponding performance function no longer exhibits a gradient, i.e., a zero (or almost zero) gradient GRAD=0 which indicates that the current estimated value CE has reached the exact value EV.

In one or more embodiments, specific performance functions may be defined for each parameter. For instance, a useful performance function both for fractional delay and for DC offset may be selected as the difference of successful detections (1-1: see the last line in the preceding table) of certain ZCF flags discussed in the following over a fixed time frame, e.g., based on a so-called Integrate and Dump (I&D) approach.

In one or more embodiments, a useful performance function for threshold(s) may be selected as the difference of false detection (1-0) events vs. missed detection (0-1) events of certain ZCF flags discussed in the following (see the second and third lines in the preceding table), again over a fixed time frame, e.g., based on an I&D approach.

In one or more embodiments, the performance function (selected, e.g., as exemplified previously) may be evaluated at two nearby points, and the estimated value of the parameter may be tuned with a control loop. In one or more embodiments such a loop may include an integral operator.

In one or more embodiments, the estimation process converges to the correct values for all the parameters, while an estimation for each parameter may become available to the user as a side effect.

In one or more embodiments, the estimation process may converge to the correct values even if fed with a hardware flag HW flag obtained as a combination (e.g., an OR-ed configuration as exemplified at 102a in FIG. 3) of the individual flags from different signal components, e.g., from different amplifiers 208 in a chain as exemplified in FIG. 3.

The whole of this processing lends itself to being effected in digital form, e.g., by a conventional DSP, e.g., as exemplified in the following.

The diagram of FIG. 11 is representative of an exemplary arrangement for a fractional delay estimator 1082 to provide an estimated fractional delay value to the delay element (filter) 1064 of FIG. 8.

In one or more embodiments, input to the estimator 1082 may include:
the input data stream, after application of the integer or bulk delay at 1060, denoted IS';
a DC offset value as estimated by the estimator 1086;
a threshold value T as estimated by the estimator 1084; and
the hardware ZCF flag, HW ZCF, from the block 102.

In one or more embodiments, the data stream IS' and the DC offset value are added in a node 300 and fed to two fractional delay blocks 302a, 302b to which the current fractional delay estimation (that is, CE in the diagrams of FIG. 10) is fed with added positive and negative deltas +$\Delta$ and −$\Delta$, respectively. The fractional delay blocks 302a, 302b may thus apply two different values of fractional delay so that a sort of corresponding gradient may be computed: see, e.g., PG or NG in FIG. 10, parts a) and b).

The outputs from the blocks 302a, 302b are subjected to windowing in zero cross blocks 304a, 304b (as a function of the threshold T) and the ZCFs, e.g., $ZCF'_{FD}$ and $ZCF''_{FD}$, obtained thereby may fed to logical product (AND) blocks 306a, 306b whose other inputs are fed with the signal HW ZCF and whose outputs converge to a difference node 308 and on to an integrate-and-dump (I&D) block 310.

Such processing produces a difference of successful detections (essentially like 1-1 events in the previous table) over a fixed time frame, which may be used as a performance function as discussed previously.

Possible low pass filtering at 312 derives from the result of I & D processing at 310 a fractional delay estimation error, for use by an integrator block 314. The output from the integrator 314 becoming constant, see, e.g., GRAD=0 in FIG. 10, part c), will correspond to a correct estimated value EV for the fractional delay, e.g., for feeding to the fractional delay filter 1064 of FIG. 8 (and possibly to other processing blocks as otherwise detailed).

The output from the block 314 is also fed to two delta generation blocks 316a, 316b for feeding to the fractional delay blocks 302a, 302b as discussed previously.

Figure 12:
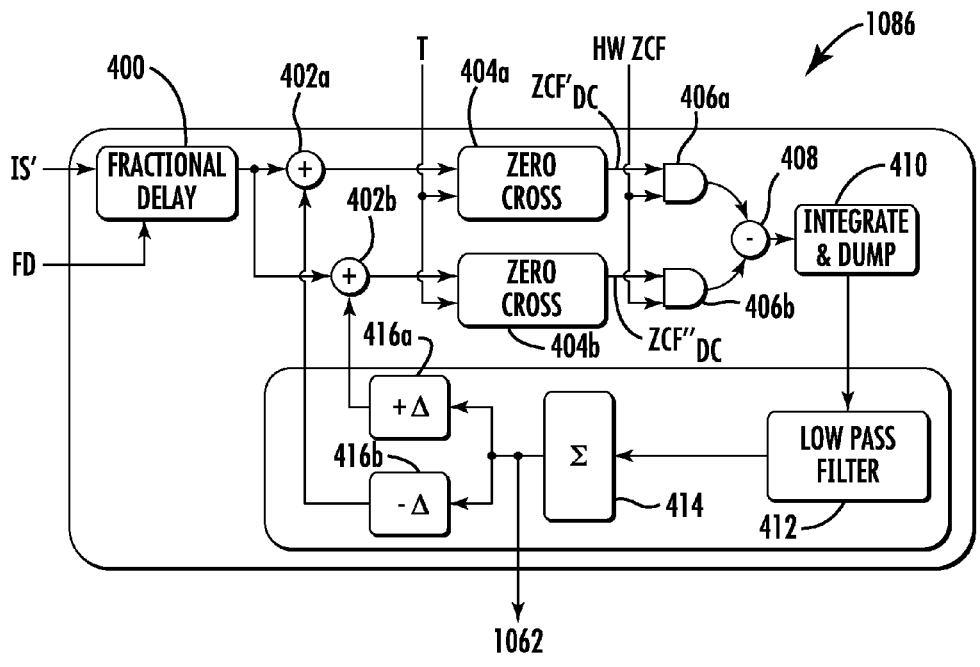

The diagram of FIG. 12 is representative of an exemplary arrangement for a DC offset estimator 1086 to provide an estimated DC offset value to the summation node 1062 of FIG. 8.

In one or more embodiments, input to the estimator 1086 may include:
the input data stream, again after application of the integer or bulk delay at 1060, denoted IS';
a fractional delay value as estimated by the estimator 1082 discussed previously;
a threshold value T as estimated by the estimator 1084; and
the hardware ZCF flag, HW ZCF, from the block 102.

In one or more embodiments, the data stream IS' and the fractional delay value are combined in a fractional delay block 400 wherein the latest (i.e. most recent) estimate available for the fractional delay is applied to the data stream IS' to be fed to two summation nodes 402a, 402b to which the current DC offset estimation (that is, CE in the diagrams of FIG. 10) is fed with added negative and positive deltas −$\Delta$ and +$\Delta$, respectively, so that, again a sort of corresponding gradient may be computed: see again, e.g., PG or NG in FIG. 10, parts a) and b).

The outputs from the nodes 402a, 402b are subjected to windowing in zero cross blocks 404a, 404b (as a function of the threshold T) and the ZCFs obtained thereby, e.g., $ZCF'_{DC}$ and $ZCF''_{DC}$, are fed to logical product (AND) blocks 406a, 406b whose other inputs are fed with the signal HW ZCF and whose outputs converge to a difference node 408 and on to an integrate-and-dump (I&D) block 410.

Such processing produces the difference of successful detections (again essentially like 1-1 events in the previous table) over a fixed time frame which may be used as a performance function as discussed previously.

Possible low pass filtering at 412 derives from the result of I & D processing at 410 a DC offset estimation error, for use in an integrator block 414. As is the case of the integrator block 314 discussed previously, the output from the integrator 414 becoming constant—see again, e.g., GRAD=0 in FIG. 10, part c)—will correspond to a correct estimated value EV for the DC offset for feeding, e.g., to the DC offset summation node 1062 of FIG. 8 (and possibly to other processing blocks as otherwise detailed). The output from the block 414 is also fed to two delta generation blocks 416a, 416b for feeding to the summation nodes 402a, 402b as discussed previously.

Figure 13:
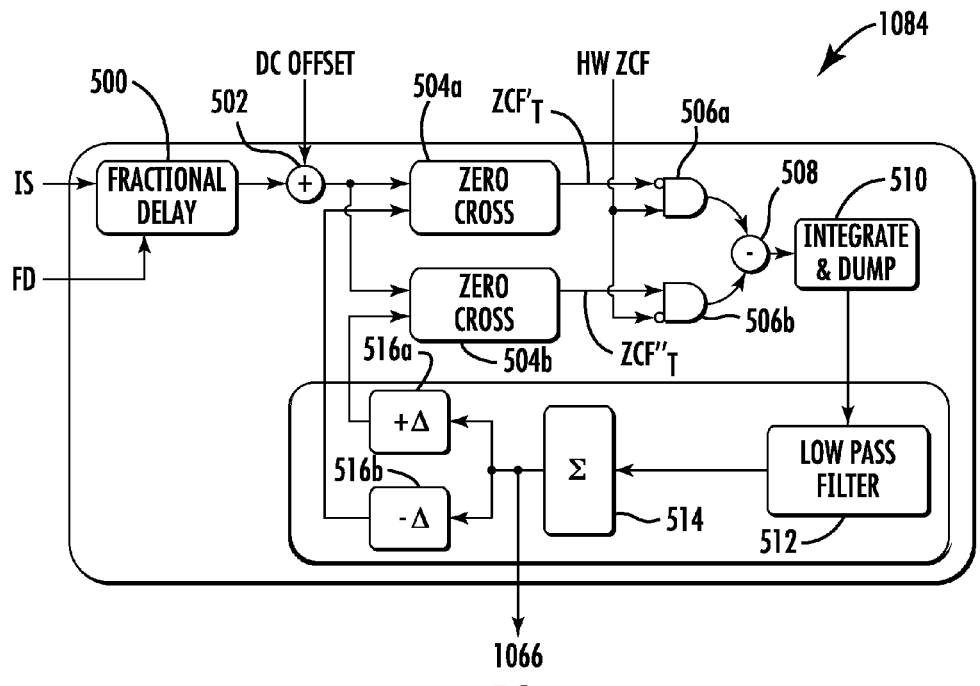

Finally, the diagram of FIG. 13 is representative of an exemplary arrangement for a threshold estimator 1084 to provide at least one estimated threshold value to the windowing logic 1066 of FIG. 8. While plural thresholds may be estimated, e.g., in the case of a non-symmetric window ZCW, a single threshold value T (e.g., for producing a symmetrical −T, +T window) is considered here for the sake of simplicity.

In one or more embodiments, input to the estimator 1084 may include:
the input data stream IS;
a fractional delay value as estimated by the estimator 1082 discussed previously;
a DC offset value as estimated by the estimator 1086; and
the hardware ZCF flag, HW ZCF, from the block 102.

In one or more embodiments, the data stream IS and the fractional delay value are combined in a fractional delay block 500 wherein (as is the case for the fractional delay block 400 discussed previously) the latest (i.e., most recent) estimate available for the fractional delay is applied to the data stream IS to be fed to a summation node 502 to which the current DC offset estimation (that is, CE in the diagrams of FIG. 10) is fed.

The output from the node 502 are subjected to windowing in zero cross blocks 504a, 504b as a function of the current estimation threshold T with added positive and negative deltas +$\Delta$ and −$\Delta$, respectively so that, once more, a sort of corresponding gradient may be computed: see once more, e.g., PG or NG in FIG. 10, parts a) and b).

The ZCFs obtained thereby, e.g., $ZCF'_T$ and $ZCF''_T$, are fed, after logical inversion (that is, in negated form) to logical product (AND) blocks 506*a*, 506*b* whose other inputs are fed with the signal HW ZCF and whose outputs converge to a difference node 508 and on to an integrate-and-dump (I&D) block 510.

Such processing produce the difference of false detections (essentially like 0-1 events in the previous table) vs. missed detections (essentially like 1-0 events in the previous table) over a fixed time frame which may be used as a performance function as discussed previously.

Figure 14:
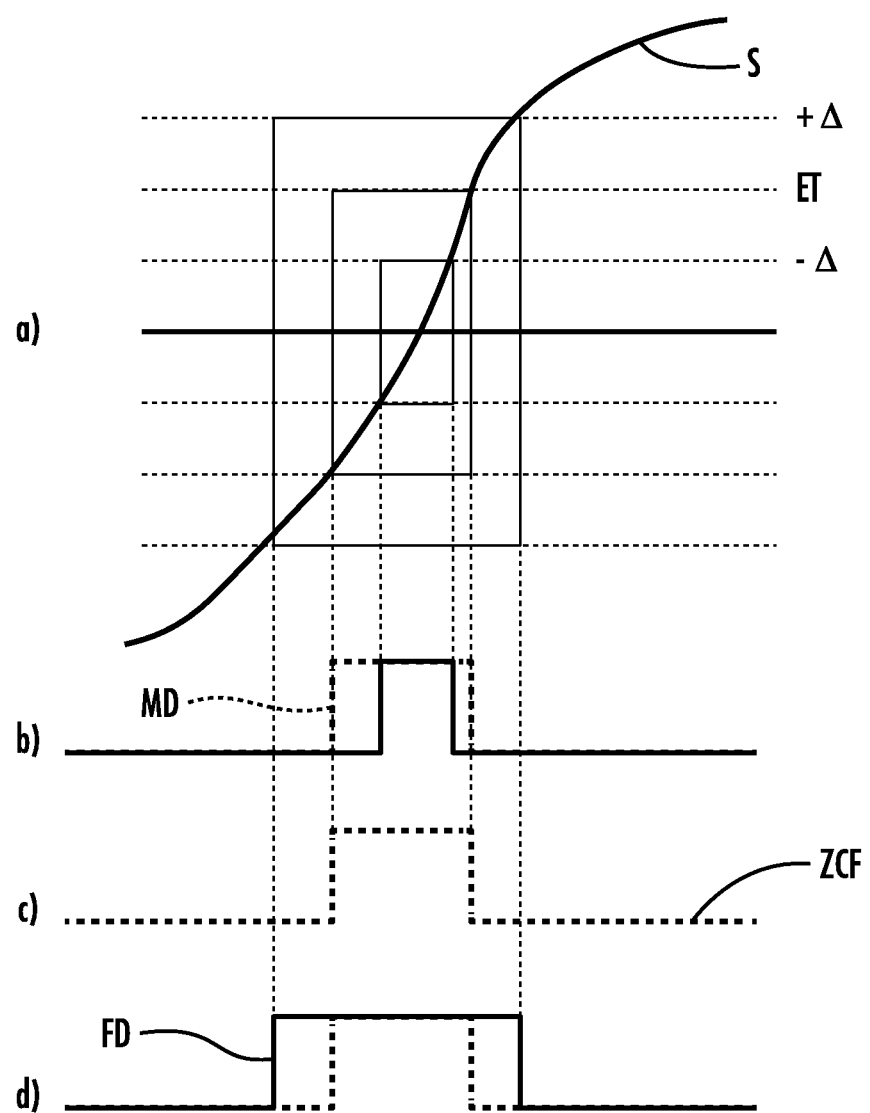
FIG. 14 is a diagram exemplary of possible operation of embodiments.

This approach is further exemplified in FIG. 14. There an exact threshold ET is shown in the upper diagram of portion a), while a corresponding ZCF for a signal S is shown in full line in portion c).

The effect of an increase (+Δ) and a decrease (−Δ) in the threshold (again a symmetrical threshold centered about zero is assumed for the sake of simplicity) in terms of missed detections MD and false detections FD is exemplified in portions b) and d) of the diagram.

Possible low pass filtering at 512 derives from the result of I & D processing at 510 a threshold estimation error, for use in an integrator block 514. As is the case of the integrator blocks 314 and 414 discussed previously, the output from the integrator 514 becoming constant—see once more, e.g., GRAD=0 in FIG. 10, part c)—will correspond to a correct estimated value EV for feeding, e.g., to the windowing logic 1066 of FIG. 8 (and possibly to other processing blocks as otherwise detailed).

The output from the block 514 is also fed to two delta generation blocks 516*a*, 516*b* for feeding to the zero cross blocks 504*a*, 504*b* as discussed previously. A basic arrangement as disclosed herein lends itself to a wide variety of possible modes of operation. For instance, in one or more embodiments, computing power may be saved by splitting in, e.g., two steps processing as discussed above.

This may involve measuring the parameters of interest during the production phase (e.g., in the factory, possibly by using optimized signals for system training) and assume that these may remain essentially constant over time as long as the processing chain being checked operates correctly. These values for the parameters may be input as adjustment parameters to the system model block (see, e.g., 106 in FIG. 2) so that during the system lifetime an alert flag AF will be emitted (only) if performance shows a degradation. In that way, runtime estimation of the parameters will not be performed, by reducing the processing requirements accordingly.

In one or more embodiments, the two-phase approach considered in the foregoing may reduce computational complexity, while permitting ZCF correlation (e.g., matching) during audio streaming, with parameters and channels not distinct and training time absorbing time in the productions process.

Specific application options/requirements may dictate whether such an approach may be preferred over continuous tracking of the parameters, e.g., a tracking process running in background during audio streaming, which may offer the advantage of all parameters being under control, possibly with distinct channels.

In one or more embodiments, continuous tracking of one or more operating parameters may permit prompt detection of any parameter falling out of a predefined acceptable range (e.g., DC offset) so that a corresponding alert flag AF may be emitted to indicate performance degradation even in the absence of any comparison of HW ZCF and Est. ZCF, while in one or more embodiments where continuous tracking is not implemented, checking of performance parameters may be based on HW ZCF and Est. ZCF only, e.g., by determining that the HW ZCF derived from the output of the D/A processing chain, e.g., from the output(s) of the power amplifiers 208 of FIG. 23, differs (e.g., does not match with) the Est. ZCF predicted for the digital input signal IS, e.g., in block 106 of FIG. 2.

One or more embodiments may thus be based on the recognition that:

one or more ZCF flags (such as Est. ZCF; $ZCF'_{FD}$ and $ZCF''_{FD}$; $ZCF'_{DC}$ and $ZCF''_{DC}$; $ZCF'_{T}$ and $ZCF''_{T}$) may be generated for the digital input signal by being estimated in digital form—e.g., by applying to the digital input signal IS e.g. a time delay (bulk or fractional), a DC offset and a windowing based on a given threshold—without D/A conversion of the digital input signal IS;

although generated in an analog context, the HW ZCF derived from the output of the D/A processing chain is intrinsically a binary signal (either 1 or 0). Once sampled, e.g., at the same sampling frequency the digital input signal, the HW ZCF is a digital signal which lends itself easily to be compared with any of the ZCF flags (e.g., Est. ZCF; $ZCF'_{FD}$ and $ZCF''_{FD}$; $ZCF'_{DC}$ and $ZCF''_{DC}$; $ZCF'_{T}$ and $ZCF''_{T}$) generated for the digital input signal.

By way of a non-limiting example, possible options for comparing HW ZCF with any ZCF flag (e.g., Est. ZCF) generated for the digital input signal may include counting the number of matches in a defined timeframe, calculating the ratio of the number of matches to the total number of HW ZCF flags over a certain time frame, calculating the variance of the number of success matching over a certain time frame, or any other ways of determining the extent or degree the two ZCF flags, correspond (e.g., coincide) with each other.

In one or more embodiments, in addition or as an alternative to generating an alert flag AF indicative of, e.g., malfunctioning, performance check processing as exemplified in the foregoing may be exploited (e.g., by processing in the block 200) to compensate/remedy for unsatisfactory performance.

In one or more embodiments, such processing may include a control loop, such as, e.g., an integrator whose input may be, for instance, a parameter such as the estimated DC offset from the DC offset estimator 1086 of FIG. 12 and whose output is a value to be subtracted from/added to the input data stream (e.g., the digital input signal IS, such processing occurring, e.g., in the DSP 200 of FIG. 3). Convergence of such a control loop will result in a DC offset measured to be practically zero and the integrator output the DC value to be compensated.

One or more embodiments may implement such a control function in real time, while the system (e.g., an audio chain) processes the real (e.g., audio) signal and the integrator tracks, e.g., the DC offset variations.

In one or more embodiments, the DC offset value may be calculated to be then subtracted (e.g., in an open loop arrangement) from the input data stream. In such an embodiment, the DC offset will not be tracked, but the unknown changes in its value may be monitored in an indirect manner via the matching function discussed previously.

In one or more embodiments, the DC offset being compensated digitally as discussed previously, will make it possible to dispense with any DC decoupling capacitors, leading to an appreciable HW optimization, since the DC offset measured value will be constantly maintained to zero, e.g., by a simple PID controller implementing the related control loop.

In one or more embodiments, an accurate, closed loop, real time measure of the DC offset will then be available. In one or more embodiments, a similar approach can be adopted also for any of the other parameters discussed in the foregoing (delay, thresholds, and so on).

More generally, various different modes of operation may be adopted for a system (digital-to-analog processing chain) as exemplified in the foregoing. For instance, one or more embodiments may involve an initial training for the identification of the parameters; these estimated parameters may then be applied in a static manner to the system model (e.g., block 106 of FIG. 2). That is, the model of the system will not change over time and a possible mismatch (lack of correspondence) of HW ZCF and Est. ZCF as measured, e.g., on the basis of any of the metrics exemplified in the foregoing may be construed as indicating an undesired alteration of the electrical parameters (e.g., a DC offset) of the system. Based thereon an alert flag AF may be raised to advise, e.g., the user of such an undesired mode of operation.

In this operation mode, the two flag signals HW ZCF and Est. ZCF may be used for the initial parameter estimation and for detecting an alert condition.

One or more embodiments may involve an operation mode wherein, after a start-up phase where a mismatch between HW ZCF and Est. ZCF will expectedly be detected (i.e., with lack of correspondence between them), the system will implement a tracking scheme with the estimation parameters updated run-time by an estimation loop and applied to the system, e.g., via the processing involving the ZCF flags $ZCF'_{FD}$ and $ZCF''_{FD}$; $ZCF'_{DC}$ and $ZCF''_{DC}$; $ZCF'_T$ and $ZCF''_T$ discussed in connection with FIGS. 10 to 14.

Once convergence is achieved, HW ZCF and Est. ZCF will expectedly be similar, that is essentially matching, insofar as the parameter estimates are valid. In that case rather than on the HW ZCF v. Est. ZCF matching, an alert flag AF may be issued based, e.g., on the very values of the estimated parameter(s), e.g., because the estimated value of a certain parameter lies outside a certain range acceptable for operation.

Any possible mismatch (lack of correspondence) of the two ZCF signals may indicate that the estimated values are not reliable because, e.g., the estimation process has not converged yet or because is has been somehow altered, with the possibility that it may re-converge more or less rapidly. Any changes in the physical changes of the system (again a DC offset may be case in point) are however likely to occur slowly so that they may be effectively tracked by the tracking loop. For that reason, an alert flag AF may be issued based, e.g., on the very values of the estimated parameter(s).

One or more embodiments as exemplified in the final portion of the previous description may involve a control loop adapted to affect the digital data stream IS input to the system. In that case, the estimated value of the parameter(s) may not be just monitored in order to understand what is going on, but may be exploited for pre-compensating the digital input IS in order to cancel out an undesired final effect on the output signal. For instance, a digital DC offset may be added to or subtracted from the digital input signal IS by adding to/subtracting from the sample data a certain set of bits corresponding to the offset added/subtracted in order to compensate (i.e., cancel out) an undesired DC offset applied to loudspeaker LS.

Still for instance, a digital delay may be applied to the digital input signal IS in order to compensate (i.e., cancel out) a different delay on stereo channels. In that case the system will continue to operate even in the presence of a possible source of malfunctioning (by compensating it), with the effect of a possible source of malfunctioning minimized due to (pre)compensation of the input signal.

In one or more embodiments, various analog components may thus be dispensed with, with advantages in terms of cost and in space, by moving towards a fully digital approach, where SW implementation is possible, while permitting real time measurement of relevant parameters One or more embodiments may thus permit to operate a signal processing chain (e.g., 202, 204, 206, 208 in FIG. 3) which produces an analog output signal OS from a digital input signal IS.

In one or more embodiments at least one first flag signal (e.g., HW ZCF) is generated for the analog output signal OS and one or more second flag signals (e.g. Est. ZCF; $ZCF'_{FD}$, $ZCF''_{FD}$; $ZCF'_{DC}$, $ZCF''_{DC}$; $ZCF'_T$, $ZCF''_T$) are generated for the digital input signal IS.

In one or more embodiments, each of these flag signals assumes a first level and a second level (e.g., 1 and 0) and is set to the first level (e.g., 1) when a signal from which the flag is generated has a value within a certain amplitude window. For instance, in case a single output signal OS is present, the flag HW ZCW may be 1 if the output signal OS lies within its thresholding window and 0 otherwise.

In the exemplary case represented in FIG. 3 herein, the various analog output signal components generate, due to thresholding at 102a, respective on/off signals which, due to the OR function performed at 102a', may produce a flag HW ZCW for the output signal OS which may be 1 if any the analog output signal components subject to thresholding at 102a lies within its thresholding window.

The same applies to any of the second flag signals such as Est. ZCF; $ZCF'_{FD}$, $ZCF''_{FD}$; $ZCF'_{FD}$, $ZCF''_{DC}$; $ZCF'_T$, $ZCF''_T$, with:

Est. ZCF generated from the signal output of the fractional delay filter 1064 via thresholding at 1066 in FIG. 8;

$ZCF'_{FD}$, $ZCF''_{FD}$ generated from the output signals of the fractional delay blocks 302a, 302b via thresholding at 304a, 304b in FIG. 11;

$ZCF'_{DC}$, $ZCF''_{DC}$ generated from the output signals of the summation nodes 402a, 402b via thresholding at 404a, 404b in FIG. 12; and $ZCF'_T$, $ZCF''_T$ generated from the output signal of the summation node 502 via thresholding at 504a, 504b in FIG. 13.

One or more embodiments as exemplified herein, the first flag signal HW ZCF and one or more of the second flag signals Est. ZCF; $ZCF'_{FD}$, $ZCF''_{FD}$; $ZCF'_{DC}$, $ZCF''_{DC}$; $ZCF'_T$, $ZCF''_T$ may be exploited in various ways in operating a digital-to-analog signal processing chain as exemplified herein. To that effect, in one or more embodiments, a first flag signal HW ZCF for the analog output signal OS may be sampled at the same sampling frequency of the digital input signal IS.

For instance, in one or more embodiments, the first flag signal HW ZCF obtained from the analog output OS and the second flag signal Est. ZCF obtained from the digital input signal IS may be compared (e.g., at 104 in FIG. 2) to calculate an amount the first flag signal HW ZCF and the second flag signal Est. ZCF match with each other.

In one or more embodiments, the amount may be selected out of:

the count of matches of the first flag signal HW ZCF and the second flag signal Est. ZCF over a certain time frame;

the ratio of the number of matches of the first flag signal HW ZCF and the second flag signal Est. ZCF to the total number of either type (HW ZCF resp. Est. ZCF) of flag signals over a certain time frame; and the variance of the number of matches of the first flag signal HW ZCF and the second flag signal Est. ZCF over a certain time frame.

In one or more embodiments, e.g., in those embodiments where the processing chain is pre-loaded with estimation parameter for Est. ZCF which are no longer modified during operation, a performance check signal AF may be generated indicative of the amount the first flag signal HW ZCF for the analog output signal OS and the second flag signal Est. ZCF the digital input signal IS match with each other. Such performance check signal may include an alert flag AF issued when that amount of matching falls below a certain performance quality threshold.

In addition or as an alternative to the foregoing, in one or more embodiments, a first flag signal HW ZCF obtained from the analog output OS and the various second flag signals ZCF; $ZCF'_{FD}$, $ZCF''_{FD}$; $ZCF'_{DC}$, $ZCF''_{DC}$; $ZCF'_T$, $ZCF''$ obtained in various ways from the digital input signal IS as exemplified in connection with FIGS. 10 to 14 may be processed to calculate (e.g., in blocks 1082, 1084, 1086 in FIG. 9) an estimate of at least one operating parameter (e.g. FD, DC offset, T) of the signal processing chain 202, 204, 206, 208. As exemplified in connection with FIG. 10, the estimate of at least one operating parameter (FD, DC offset, T) of the signal processing chain 202, 204, 206, 208 may be calculated as a target value EV which optimizes a respective performance function, preferably by minimizing the gradient thereof (see, e.g., GRAD=0 in FIG. 10).

In one or more embodiments, if the estimated operating parameter includes a delay FD and/or a DC offset, the performance function may be selected as the difference (e.g., computed at nodes 308, 408 in FIGS. 11 and 12) of successful detections (1-1 in the previous table) of the first flag signal HW ZCF the second flag signal (see e.g. $ZCF'_{FD}$, $ZCF''_{FD}$ for the fractional delay in FIG. 11 or $ZCF'_{DC}$, $ZCF''_{DC}$ for the DC offset in FIG. 12) over a time frame, as determined e.g. by the Integrate & Dump blocks 310, 410.

In one or more embodiments, if the estimated operating parameter includes a windowing threshold T, the performance function may be selected as the difference (e.g., computed at node 508 in FIG. 13) of false detection events and missed detection events (see, e.g., FD and MD in FIG. 14) of the first flag signal HW ZCF and the second flag signal $ZCF'_T$, $ZCF''_T$ over a time frame, as determined, e.g., by the Integrate & Dump block 510 in FIG. 13.

In one or more embodiments, a performance check signal such as an alert flag AF may be issued if the estimated value of at least one operating parameter such as, e.g., FD, DC offset or T lies outside a certain range acceptable for operation.

In one or more embodiments, wherein an estimate is calculated of at least one operating parameter (e.g., FD, DC offset, T) of the signal processing chain 202, 204, 206, 208, the estimated operating parameter such as, e.g., DC offset may be fed to a control loop, preferably acting on the digital input signal IS, to compensate for system performance impairment, e.g., as possibly induced by the estimates operating parameter moving outside a certain range acceptable for operation.

In one or more embodiments, generating the one or more second flag signals for the digital input signal IS may include applying to the digital input signal IS one or more of:

a delay, as is the case of the delays 1060 and 1064 applied to IS to generate Est. ZCF in FIG. 8, or the delays ADJ, 302a, 302b; ADJ, 400; 500 of FIGS. 9 to 13, a DC offset, as is the case of the DC offset 1062 applied to IS to generate Est. ZCF in FIG. 8, or the DC offsets 300, 302b; 402a, 402b; 502 of FIGS. 9 to 13; and windowing as a function of one or more thresholds, as is the case of the windowing 1066 applied to IS to generate Est. ZCF in FIG. 8, or the windowing blocks 304a, 304b; 404a, 404b; 504a, 504b of FIGS. 9 to 13.

Without prejudice to the underlying principles, the details and embodiments may vary, even significantly, with respect to what is illustrated herein purely by way of non-limiting examples, without thereby departing from the extent of protection. The extent of protection is determined by the claims that follow.

That which is claimed is:

1. A method of operating a signal processing chain producing an analog output signal from a digital input signal, the method comprising:

generating at least one first flag signal for the analog output signal and at least one second flag signal for the digital input signal, with generation of the at least one second flag signal being based on both the digital input signal and the at least one first flag signal, and with the at least one first and second flag signals having a first level and a second level and each being set to the first level when a respective signal from which the at least one first and second flags is generated has a value within an amplitude window; and calculating, as a function of the at least one first flag signal and the at least one second flag signal, at least one of an amount at least one first flag signal for the analog output signal and at least one second flag signal for the digital input signal match each other, and an estimate of at least one operating parameter of the signal processing chain.

2. The method of claim 1, further comprising sampling each first flag signal for the analog output signal at a same sampling frequency of the digital input signal.

3. The method of claim 1, further comprising generating a second flag signal for the analog output signal for a combination of a plurality of output signal components, with the combination being an OR combination.

4. The method of claim 1, further comprising calculating the amount the at least one first flag signal for the digital input signal and the at least one second flag signal match each other as at least one of the following:

a count of matches of the at least one first flag signal and the at least one second flag signal over a time frame;

a ratio of a number of matches of the at least one first flag signal and the at least one second flag signal to a total number of either type of the flag signals over the time frame; and a variance of a number of matches of the at least one first flag signal and the at least one second flag signal over the time frame.

5. The method of claim 1, further comprising:

calculating an amount the at least one first flag signal for the digital input signal and the at least one second flag signal match with each other; and generating a performance check signal indicative of the amount, with the performance check signal comprising an alert flag issued when the amount falls below a performance quality threshold.

6. The method of claim 1, further comprising calculating the estimate of at least one operating parameter of the signal processing chain as a target value based on a respective performance function by reducing a gradient of the respective performance function.

7. The method of claim 6, wherein the at least one estimated operating parameter comprises at least one of a delay and a DC offset, and selecting the performance function as a difference of successful detections of the at least one first flag signal and the at least one second flag signal over a time frame.

8. The method of claim 6, wherein the at least one estimated operating parameter includes a windowing threshold, and selecting the performance function as a difference of false detection events and missed detection events of the at least one first flag signal and the at least one second flag signal over a time frame.

9. The method of claim 1, further comprising generating a performance check signal if the estimate of the at least one operating parameter lies outside a range for operation, with the performance check signal including an alert flag.

10. The method of claim 1, further comprising feeding the estimate of the at least one operating parameter to a control loop acting on the digital input signal to compensate for system performance impairment.

11. The method of claim 1, wherein generating the at least one second flag signal for the digital input signal comprises applying to the digital input signal at least one of a delay, a DC offset, and an amplitude window.

12. A device for operating a signal processing chain producing an analog output signal from a digital input signal, the device comprising:
at least one flag generating circuit configured to generate at least one first flag signal for the analog output signal and at least one second flag signal for the digital input signal, with generation of the at least one second flag signal being based on both the digital input signal and the at least one first flag signal, and with the at least one first and second flag signals having a first level and a second level and each being set to the first level when a respective signal from which the at least one first and second flags is generated has a value within an amplitude window; and
a processor configured to calculate, as a function of the at least one first flag signal and the at least one second flag signal, at least one of
an amount at least one first flag signal for the analog output signal and at least one second flag signal for the digital input signal match each other, and
an estimate of at least one operating parameter of the signal processing chain.

13. The device of claim 12, wherein said processor is configured to sample each first flag signal for the analog output signal at a same sampling frequency of the digital input signal.

14. The device of claim 12, wherein said at least one flag generating circuit is configured to generate a second flag signal for the analog output signal for a combination of a plurality of output signal components, with the combination being an OR combination.

15. The device of claim 12, wherein said processor is configured to calculate the amount the at least one first flag signal for the digital input signal and the at least one second flag signal match each other as at least one of the following:
a count of matches of the at least one first flag signal and the at least one second flag signal over a time frame;
a ratio of a number of matches of the at least one first flag signal and the at least one second flag signal to a total number of either type of the flag signals over the time frame; and
a variance of a number of matches of the at least one first flag signal and the at least one second flag signal over the time frame.

16. The device of claim 12, wherein said processor is configured to:
calculate an amount the at least one first flag signal for the digital input signal and the at least one second flag signal match with each other; and
generate a performance check signal indicative of the amount, with the performance check signal comprising an alert flag issued when the amount falls below a performance quality threshold.

17. The device of claim 12, wherein said processor is configured to calculate the estimate of at least one operating parameter of the signal processing chain as a target value based on a respective performance function by reducing a gradient of the respective performance function.

18. An apparatus comprising:
a signal processing chain configured to drive at least one loudspeaker, and to produce an analog output signal from a digital input signal; and
a device configured to operate said signal processing chain and comprising
at least one flag generating circuit configured to generate at least one first flag signal for the analog output signal and at least one second flag signal for the digital input signal, with generation of the at least one second flag signal being based on both the digital input signal and the at least one first flag signal, and with the at least one first and second flag signals having a first level and a second level and each being set to the first level when a respective signal from which the at least one first and second flags is generated has a value within an amplitude window,
a processor configured to calculate, as a function of the at least one first flag signal and the at least one second flag signal, at least one of
an amount at least one first flag signal for the analog output signal and at least one second flag signal for the digital input signal match each other, and
an estimate of at least one operating parameter of the signal processing chain.

19. The apparatus of claim 18, wherein said processor is configured to sample each first flag signal for the analog output signal at a same sampling frequency of the digital input signal.

20. The apparatus of claim 18, wherein said at least one flag generating circuit is configured to generate a second flag signal for the analog output signal for a combination of a plurality of output signal components, with the combination being an OR combination.

21. The apparatus of claim 18, wherein said processor is configured to calculate the amount the at least one first flag signal for the digital input signal and the at least one second flag signal match each other as at least one of the following:
a count of matches of the at least one first flag signal and the at least one second flag signal over a time frame;
a ratio of a number of matches of the at least one first flag signal and the at least one second flag signal to a total number of either type of the flag signals over the time frame; and
a variance of a number of matches of the at least one first flag signal and the at least one second flag signal over the time frame.

22. The apparatus of claim 18, wherein said processor is configured to:

calculate an amount the at least one first flag signal for the digital input signal and the at least one second flag signal match with each other; and generate a performance check signal indicative of the amount, with the performance check signal comprising an alert flag issued when the amount falls below a performance quality threshold.

23. The apparatus of claim 18, wherein said processor is configured to calculate the estimate of at least one operating parameter of the signal processing chain as a target value based on a respective performance function by reducing a gradient of the respective performance function.

24. A non-transitory computer-readable medium to be loaded into a memory of at least one processor for causing the processor to operate a signal processing chain to produce an analog output signal from a digital input signal by:

generating at least one first flag signal for the analog output signal and at least one second flag signal for the digital input signal, with generation of the at least one second flag signal being based on both the digital input signal and the at least one first flag signal, and with the at least one first and second flag signals having a first level and a second level and each being set to the first level when a respective signal from which the at least one first and second flags is generated has a value within an amplitude window; and calculating, as a function of the at least one first flag signal and the at least one second flag signal, at least one of an amount at least one first flag signal for the analog output signal and at least one second flag signal for the digital input signal match each other, and an estimate of at least one operating parameter of the signal processing chain.

* * * * *